US009779203B2

(12) United States Patent
Donnelly (10) Patent No.: US 9,779,203 B2
(45) Date of Patent: Oct. 3, 2017

(54) METHOD AND SYSTEM FOR COMPUTER-AIDED DESIGN OF RADIATION-HARDENED INTEGRATED CIRCUITS

(71) Applicant: TallannQuest LLC, Dallas, TX (US)

(72) Inventor: Emily Ann Donnelly, Sachse, TX (US)

(73) Assignee: TallannQuest LLC, Sachse, TX (US)

( * ) Notice: Subject to any disclaimer, the term of this patent is extended or adjusted under 35 U.S.C. 154(b) by 0 days.

(21) Appl. No.: 15/382,914

(22) Filed: Dec. 19, 2016

(65) Prior Publication Data

US 2017/0098028 A1   Apr. 6, 2017

Related U.S. Application Data

(63) Continuation of application No. 14/681,028, filed on Apr. 7, 2015, now Pat. No. 9,569,583.

(60) Provisional application No. 61/976,482, filed on Apr. 7, 2014.

(51) Int. Cl.
*G06F 17/00* (2006.01)
*G06F 17/50* (2006.01)

(52) U.S. Cl.
CPC ...... *G06F 17/5081* (2013.01); *G06F 17/5036* (2013.01); *G06F 17/5072* (2013.01)

(58) Field of Classification Search
USPC ........................................................ 716/112
See application file for complete search history.

(56) References Cited

U.S. PATENT DOCUMENTS

| | | | | | |
|---|---|---|---|---|---|
| 5,220,192 | A | * | 6/1993 | Owens | H01L 21/76218 257/519 |
| 2002/0171104 | A1 | * | 11/2002 | Cable | H01L 27/1203 257/347 |
| 2002/0182884 | A1 | * | 12/2002 | Bernkopf | H01L 21/02164 438/758 |
| 2005/0006703 | A1 | * | 1/2005 | Miscione | H01L 21/86 257/347 |
| 2011/0088008 | A1 | * | 4/2011 | Fifield | G06F 11/1048 716/136 |
| 2015/0286772 | A1 | * | 10/2015 | Donnelly | G06F 17/5072 716/112 |

* cited by examiner

*Primary Examiner* — Mohammed Alam
(74) *Attorney, Agent, or Firm* — Gregory A. Magel (57) ABSTRACT

A method, system, and computer program product include electronic design automation (EDA) tools used with standard CMOS processes to design and produce radiation-hardened (rad-hard) integrated circuits (ICs) having a predictable level of radiation hardness while maintaining a desired level of performance and tracking circuit area. The tools include rad-hard design rule checking (DRC) decks, rad-hard SPICE models, and rad-hard cell libraries. A rad-hard parasitic components extraction process makes use of rad-hard DRC rules to locate occurrences of parasitic devices, calculate their effects on circuit performance, and return this information to layout and circuit simulation tools. Changes to the layout are suggested and implemented with varying degrees of automation. Some of these tools can be provided as components of a rad-hard process design kit (PDK). They can be used in conjunction with commercial EDA tools to facilitate the incorporation of rad-hard features into new or existing IC designs.

10 Claims, 9 Drawing Sheets

METHOD AND SYSTEM FOR COMPUTER-AIDED DESIGN OF RADIATION-HARDENED INTEGRATED CIRCUITS

CROSS-REFERENCE TO RELATED APPLICATIONS

This application is a continuation of application Ser. No. 14/681,028, filed Apr. 7, 2015, which claims the benefit of U.S. Provisional Application No. 61/976,482, filed Apr. 7, 2014.

BACKGROUND OF THE INVENTION

1. Field of the Invention

The present invention relates in general to semiconductor integrated circuit (IC) design, and more specifically to the field of electronic design automation (EDA) for designing radiation-hardened CMOS integrated circuits.

2. Description of the Related Art

Radiation-hardened ("rad-hard") integrated circuits are required for a wide range of commercial market applications, including medical and dental electronics (computed tomography x-ray scanners, implantables, etc.), avionics, space/satellite, and nuclear power systems, as well as military and defense systems. Currently-available rad-hard ICs, particularly those capable of surviving a high radiation dose of >300 krad (3000 Gy), depending on customer need, generally require the use of special materials, such as silicon-on-insulator (SOI) substrates, and a dedicated fabrication process. This results not only in extra expense in producing these devices, but more importantly, places the design and production of these devices outside the mainstream of leading-edge commercially-available ICs. The result is that rad-hard versions of high-performance commercial devices using commercial processes are not readily available for use in critical applications requiring high tolerance to radiation (like sterilization of implantable medical devices). In order for designers of rad-hard systems to obtain new rad-hard ICs, particularly those at advanced technology nodes, they are forced to accept longer time-to-market, compromises in performance, and significantly increased cost if they use the typical rad-hard IC development flow including a full custom design and its implementation in a specialty rad-hard process.

For example, there has been a typical 7-year performance gap (2+ generations) between space-qualified microprocessors and commercially-available processors. This corresponds to a dramatic potential performance improvement that could be achieved using state-of-the-art commercial processes as compared to >2 generations-behind rad-hard processes. The ability to use existing advanced standard processes would enable superior performance from the electronics, compared to special process flows and materials, and extend component life.

There is accordingly a need to enable the design and production of cost-effective rad-hard ICs using standard commercial CMOS and BiCMOS processes. Time to market would be much faster given the ability to convert existing commercial IC products to rad-hard versions, with changes only in the physical transistor design and layout.

CMOS hardness-by-design approaches use design techniques to overcome the inherent susceptibility of commercial CMOS technologies to radiation. [For example, see R. C. Lacoe et al., IEEE Trans. Nuclear Science, vol. 47, pp. 2334-2341 (2000).] A number of rad-hard device designs and layout techniques are known that can be used to improve the radiation performance of ICs, and a limited number of rad-hard libraries of standard cells for ASICs are available. But most rad-hard design continues to be a very manual process and follows the full custom design flow, depending greatly on the skill and knowledge of the designer. Thus there remains a need for EDA tools that can be used more generally to help convert existing commercial IC designs in order to improve their radiation-hardness performance, while maintaining their other cost and performance advantages.

SUMMARY OF THE INVENTION

These and other problems associated with the prior art are addressed by the present invention, which provides a computer-implemented method, system, and computer program product for designing radiation-hardened ("rad-hard") integrated circuits. The invention provides a set of electronic design automation (EDA) tools that can be used in conjunction with standard computer-aided design (CAD) environments from any of a number of commercial software vendors to aid in the creation of IC designs, that, when implemented in standard analog, digital, or mixed-signal CMOS processes, result in the production of ICs having a predictable level of resistance ("hardness") to ionizing radiation such as x-rays, as well as maintaining a desired level of performance and function. The ability to use existing advanced standard processes enables superior performance from the electronics, compared to special process flows and materials, and extends component life. The computer-implemented method assists the designer by providing predetermined rad-hard design layout methods, rules and verification techniques as well as rad-hard device types, and facilitating their incorporation into a standard IC design to enhance its radiation hardness. These predetermined techniques and devices can include rad-hard design rules, which may be provided in the form of a rad-hard design rule checking (DRC) deck; rad-hard device models, such as SPICE (Simulation Program with Integrated Circuits Emphasis) models that incorporate parasitic devices and parameter variations induced by exposure to radiation; and predesigned individual devices, rad-hard cell libraries and parameterized cells ("PCells") that may be used to substitute for standard, non-rad-hard devices. Any of these predetermined techniques or devices can be supplied as components of a rad-hard process design kit ("PDK") for use with a particular standard IC process. The invention also provides a rad-hard parasitic components extraction process that can make use of rad-hard DRC rules to locate occurrences of parasitic devices such as n-channel parasitic thick field transistors, calculate their effects on circuit performance, and return this parasitic component information to the layout, schematic, or circuit simulation tools. The invention may be used as well to keep track of circuit area, size, and cost as rad-hard features are introduced into the IC design.

More specifically, the present invention provides a computer-implemented method for designing a radiation-hardened integrated circuit. A schematic of a circuit is entered, as well as a list of requirements or specifications including at least a radiation-hardness requirement. A layout of the circuit is performed, and the radiation performance of the circuit as laid out is assessed using a computer device. If the assessed radiation performance does not meet the radiation-hardness requirement, a change to the layout of the circuit is suggested, and the layout is changed in response to the suggestion, resulting in a radiation-hardened IC design.

In some embodiments, the present invention also provides a system for designing a radiation-hardened integrated circuit having at least one processor that is programmed to enter a schematic of a circuit and a list of requirements comprising at least a radiation-hardness requirement, perform a layout of the circuit, assess, at the computer device, the radiation performance of the circuit as laid out, suggest a change to the layout of the circuit if the assessed radiation performance does not meet the radiation-hardness requirement, and change the layout in response to the suggested change to produce a radiation-hardened design. In some embodiments, the processor can be programmed to perform the steps of this process automatically, and in other embodiments, the system can aid the user in performing the process; that is, various embodiments can implement a range of degrees of automation.

In other embodiments, the present invention provides a computer program product for designing a radiation-hardened integrated circuit, comprising a storage medium readable by a processing circuit, having stored on it a sequence of instructions for execution by the processing circuit. The sequence of instructions directs the processing circuit to perform a method comprising entering a schematic of a circuit and a list of requirements including at least a radiation-hardness requirement, performing a layout of the circuit, assessing the radiation performance of the circuit as laid out, suggesting a change to the layout of the circuit if the assessed radiation performance does not meet the radiation-hardness requirement, and changing the layout in response to the suggested change, in order to produce a radiation-hardened IC design.

Other features and advantages of the present invention will be apparent to those of ordinary skill in the art upon reference to the following detailed description taken in conjunction with the accompanying drawings, and the appended claims.

BRIEF DESCRIPTION OF THE SEVERAL VIEWS OF THE DRAWINGS

For a more complete understanding of the present invention, and the advantages thereof, reference is now made to the following description taken in conjunction with the accompanying drawings, in which.

DETAILED DESCRIPTION

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

The effects of radiation on metal-oxide-semiconductor (MOS) integrated circuits are various and complex, but reasonably well understood and documented. For this discussion, we will concentrate on ionizing radiation and total ionizing dose (TID) as a measure of exposure. The basic effects of ionizing radiation relate to the buildup of charge in oxide structures and interfaces in MOS devices. These effects are summarized in T. R. Oldham et al., IEEE Trans. Nuclear Science vol. 50, pp. 483-499 (2003). In general, radiation causes the operating parameters of transistors (and other devices) to change as a function of total exposure. Certain areas of the devices, which can be pinpointed in the circuit layout, are particularly susceptible to radiation. Knowledge of those areas in the layout that are particularly susceptible to radiation can be used in embodiments of the present invention to direct attention of the circuit designer and to suggest changes that will improve the radiation tolerance of the circuit under design. Using known parameters determined by measurements and device modeling, design rules for use by rad-hard Design Rule Checkers (DRC) are provided in embodiments of the present invention.

One example is the particularly radiation-sensitive region in the dielectric isolation (field) between active areas. If a conductor at positive potential crosses this region, then holes generated in the oxide by the radiation will accumulate at the silicon (Si)/silicon dioxide ($SiO_2$) interface. For p-type silicon, this will create an inversion layer allowing leakage current to pass from the region at higher voltage potential to the region at lower potential. This type of structure is called an n-channel parasitic thick field transistor and is a common by-product of many of the isolation techniques used in IC designs. The threshold or turn-on voltage ($V_{tfn}$) of this parasitic device is generally much higher than the operating voltage of the circuit so that in normal circuit operating conditions this transistor will not conduct, and therefore will not cause serious leakage current. However, exposure to ionizing radiation will cause the $V_{tfn}$ of the n-channel parasitic field transistor to decrease (whereas $V_{tfp}$ of the p-channel is increased and therefore harder to turn on). Current will flow from one active area to another. This unexpected leakage current can cause the circuit to move out of specification or stop functioning altogether.

SPICE (Simulation Program with Integrated Circuits Emphasis) is an electronic circuit simulator. It is used in the design of integrated circuits to verify that the design meets its targeted specifications and to predict circuit behavior across operating ranges before the IC is manufactured. Each device used in the IC has a variety of unique electrical parameters associated with it. The parametric characteristics of these devices determine the performance and functionality of the IC. SPICE models of devices are commonly generated having statistical variations within the circuit operating ranges for varying voltage, current, timing, and temperature, etc. Circuits can be simulated using these statistical models to verify that they meet their targeted specifications over normal process variations.

Exposure to radiation also has an effect on some critical SPICE parameters. For example, transistor threshold voltage ($V_t$) or turn-on voltage shifts become more negative with radiation exposure and may move out of operating range. NMOS leakage currents also increase. The shifts in these parameters with radiation dose can cause the circuit under design to not meet specifications or to completely malfunction. SPICE models that include radiation effects on these parameters as a function of various radiation dose levels are generated and incorporated into embodiments of the present invention, allowing the prediction of such scenarios. Not all devices are affected equally by exposure to radiation. Radiation-adjusted SPICE models (rad-hard SPICE models) are generated for devices that are determined, from electrical testing, to be adversely affected by radiation. These models can be generated as a function of radiation dose levels. A parasitic extraction deck that incorporates radiation-adjusted models can also be used in embodiments of the present invention to indicate potential circuit failure as it is exposed to radiation. Information from the radiation-adjusted device and parasitic SPICE models using embodiments of the present invention allow the circuit designer an option to use alternate device layouts such that the circuit will function within its operating specifications when exposed to radiation.

Figure 2:
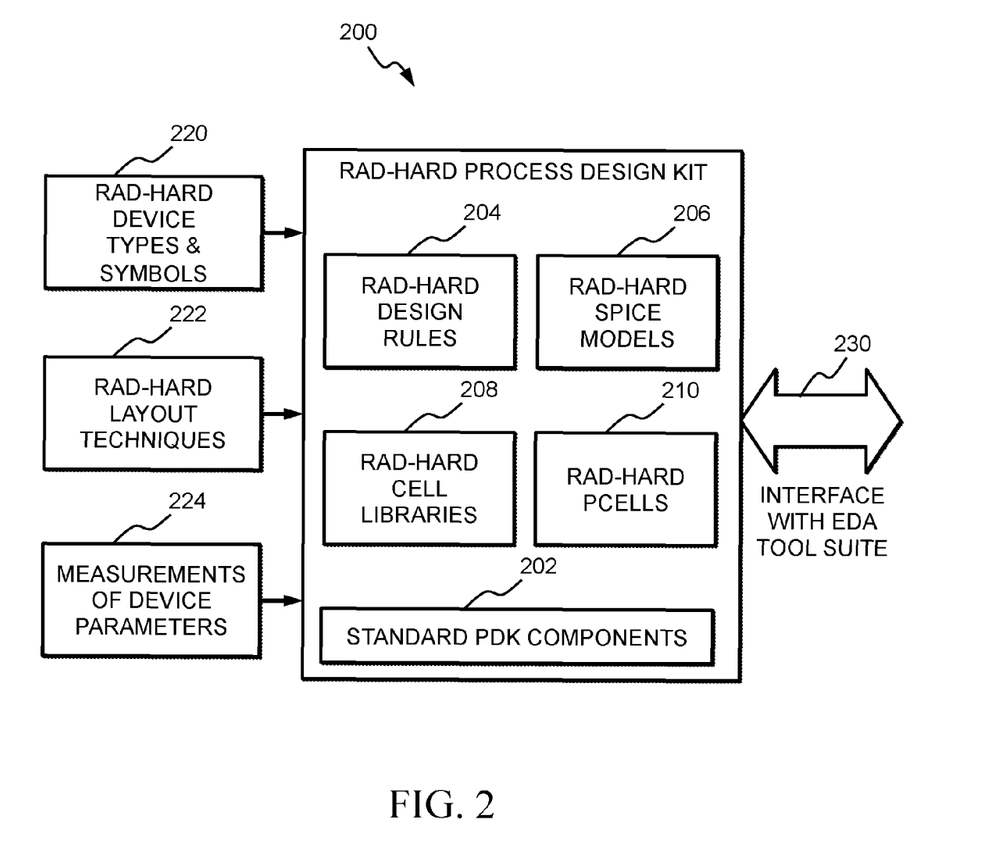
FIG. 2 is a block diagram illustrating a rad-hard process design kit according to an embodiment of the present invention.

The rad-hard design rules and SPICE parameters developed as described herein can be added into a rad-hard process design kit (rad-hard PDK), as described later with reference to FIG. 2, to help simulate and analyze the trade-offs of improved radiation tolerance versus design performance and circuit area. Methods to develop these rules can be based on a combination of (a) radiation testing and modeling at various dose levels and electrical biases to generate the SPICE parameters of the devices, and (b) design rules that comprehend device sensitivity to radiation exposure. If a particular IC process is intended to produce rad-hard ICs, then a rad-hard PDK for that process can include the radiation-tolerant design rules and SPICE parameters, as will be described later in connection with FIG. 2.

Figure 1A:
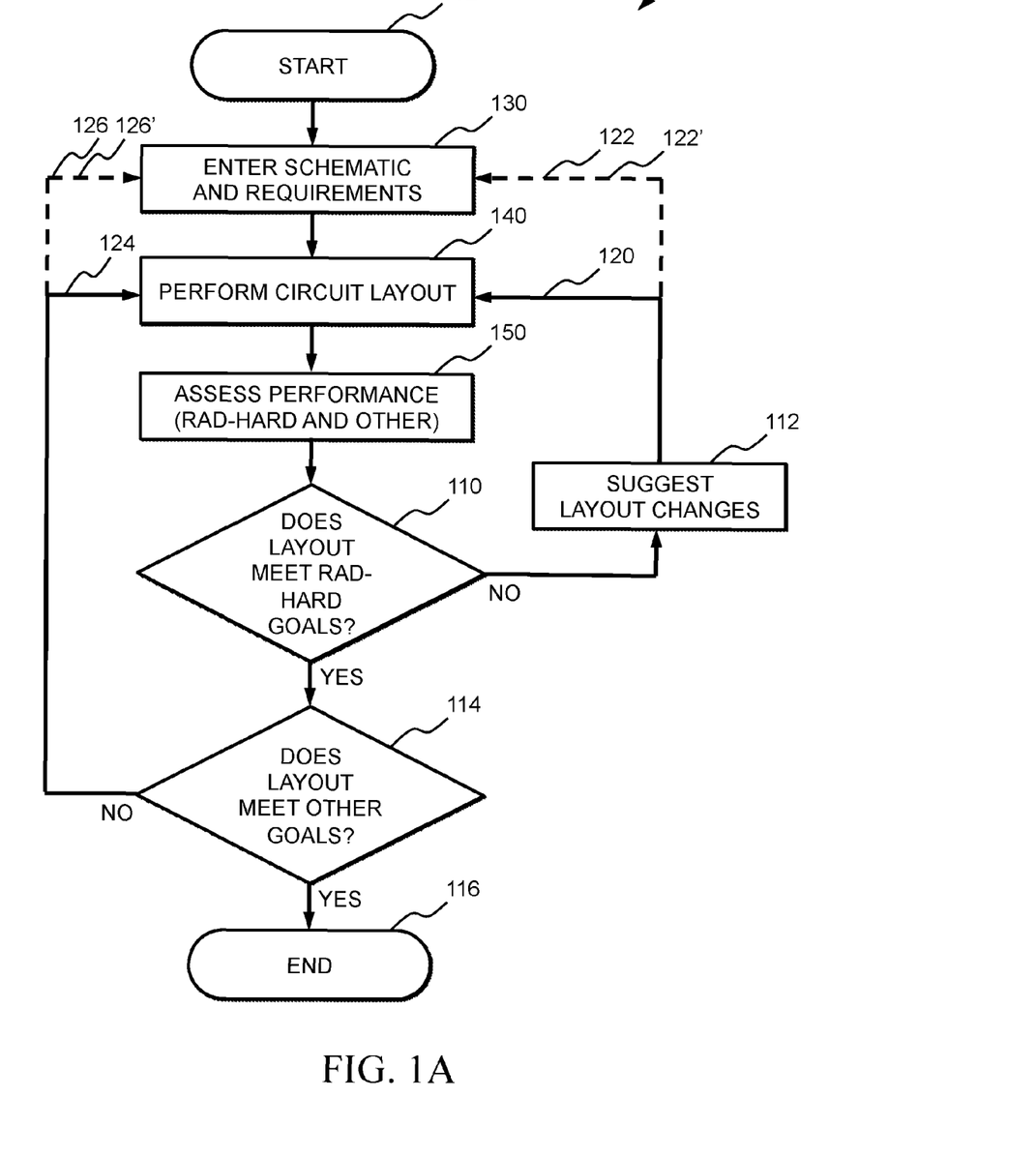
FIG. 1A is a flow chart illustrating a method for designing a radiation-hardened integrated circuit according to an embodiment of the present invention.

Referring now to FIG. 1A, a flow chart illustrating a computer-implemented method 100 for designing radiation-hardened integrated circuits according to an embodiment of the present invention is shown. A design of a rad-hard IC begins at step 102. First the step 130 of entering a schematic and requirements (the terms "specifications" or "goals" may also be used herein interchangeably with "requirements") is performed. It is at this point that the desired functionality and performance of the circuit, as well as the desired level of tolerance to radiation and process variations, are determined. This step will be discussed in more detail later with reference to FIG. 1B. If there is an existing schematic before starting process 100, the schematic may not have to be constructed/entered from scratch, but it will need to be imported into the design software for circuit simulations to be performed later during the analysis and optimization processes for the design. After the schematic and requirement are entered, an initial circuit layout can be performed in step 140. Circuit layout may be performed using the physical design capabilities of electronic design automation (EDA) tools. Note that if an initial layout is already available, such as might be the case with an existing circuit for which radiation hardening is desired to be performed, then it may be imported into the design in this step. This step will also be discussed later in more detail with reference to FIG. 1C. In step 150, the performance of the designed circuit as laid out is assessed. The primary goal of this process is to result in an IC design that functions as desired up to a known level of exposure to radiation. The dose level at which performance deteriorates below specifications will be referred to herein as the rad-hard performance. Thus assessing performance includes calculating this maximum dose level, i.e. assessing the rad-hard performance. In order to perform trade-off analysis as to whether other specifications of interest are adversely affected by measures taken to improve rad-hard performance, this assess performance step includes the calculation of other parameters of the design. Examples of other parameters for which performance may need to be traded off include design performance metrics/goals such as die area, clock rate, timing, and process variation tolerance. These parameters may (or may not) be made worse as the rad-hard performance improves due to implementing changes in the circuit layout. The goal of the finished design will be to achieve a desired radiation tolerance (rad-hard performance level) in conjunction with other IC design specifications including cost, which is partly related to die area. This step will also be discussed in more detail later with reference to FIG. 1D.

Once the rad-hard and other performance goals have been assessed, a decision can be made in step 110 as to whether further work is needed to meet the rad-hard goals. If the assessed rad-hard performance does not meet the rad-hard goals specified in step 130 (i.e., the answer is NO in decision block 110), then the flow is directed to step 112, in which layout changes can be suggested according to an embodiment of the present invention. Examples of types of layout changes that can be suggested will be discussed later in reference to FIGS. 4A through 4F. The changes that are suggested may be based on design rule checking using the rad-hard DRC, and parasitic component extraction from the layout to generate parasitic SPICE models (together with the rad-hard SPICE models), which will also be described later with reference to FIG. 3. The suggested changes may be displayed directly to the user on the layout in the physical design view on the monitor running the EDA tool. Alternatively, a separate report or list may be generated and presented instead of, or together with, the physical layout view, with a device list or portions of the layout that have issues ranked in order of impact on radiation hardness (e.g. in order of increasing radiation tolerance). Likewise, a ranked report by impact on other selected parameters to be used in the trade-off determination (such as circuit area, and performance parameters such as speed or power consumption) can also be presented.

After the suggested layout changes are presented to the user, the user has the option to implement the suggested changes. This can be done by taking path 120 back to revisit step 140 and perform more circuit layout. It is also possible that the user may consider that the suggested layout changes are too major to implement immediately by changing the layout. In this case, optional path 122 or optional path 122' can be taken back to either change the circuit schematic or revise the requirements in block 130. The two paths 122 and 122' differ only as to at what point within block 130 the paths enter, and refer respectively to the path to revise the schematic (path 122) or the path to revise the requirements (path 122'), which requirements can either relate to the radiation hardness goals or the other goals.

After the design meets the primary radiation hardness goals, i.e., if the answer from decision block 110 is YES, then a secondary decision block 114 is encountered to consider whether the layout (or design) meets the other, non rad-hard related goals. This decision could be considered simultaneously with decision 110, or before it, without affecting the overall resulting design. In any case, a NO output indicating that other goals are not met sends the flow either (path 124) back to circuit layout (step 140) or to step 130, to revise the schematic and/or requirements. Paths 126 and 126' again indicate whether the process is entering step 130 to revise the schematic (path 126) or to revise the goals (path 126').

Once both the rad-hard goals and other goals have been met by the IC design, the path out of decision 114 is YES leading to a successful conclusion of the design ending at END step 116.

Figure 1B:
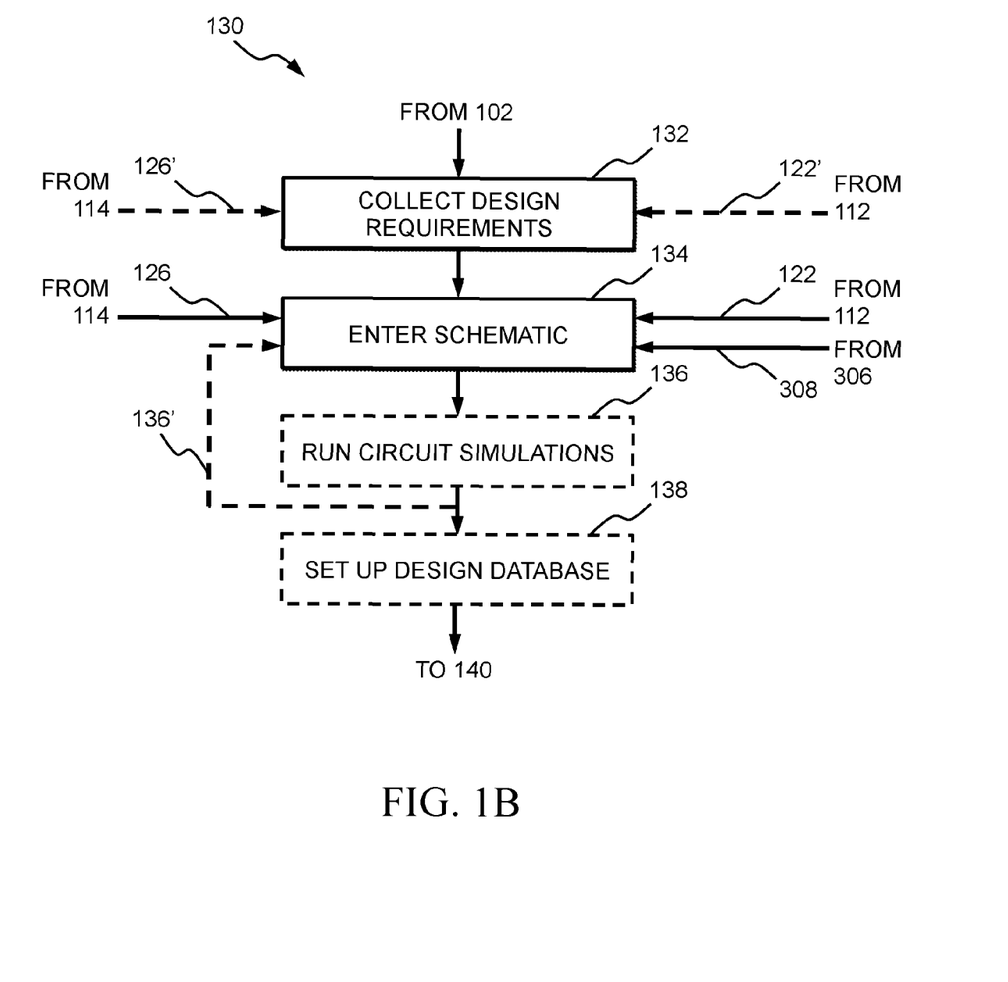
FIGS. 1B through 1D are flow charts illustrating more detailed versions of steps in a method for designing a radiation-hardened integrated circuit according to an embodiment of the present invention.

FIG. 1B is a flow chart illustrating more detail within sub-process step 130 "enter schematic and requirements." On the first time through this step, this portion of the flow chart is entered from START step 102. On subsequent entries, i.e. if the schematic or specifications need to be revised, sub-process step 130 is entered either from step 112 with suggested layout changes to improve radiation hardness, or from step 114, the decision block related to meeting other design goals. The details of these re-entries were described above. Referring to FIG. 1B, it can be seen that the first step 132 is to collect (or revise) design specifications or requirements. The second step 134 is to enter, import, or revise the schematic. Another input to the schematic, path 308, is also shown and will be discussed later with respect to parasitic component extraction in FIG. 3. The last two steps are optional and indicated as such by dashed line boxes. In step 136, circuit simulations such as SPICE are run to determine the initial performance and function of the circuit before any suggested layout changes are made. Path 136', which loops back to step 134 from step 136, accounts for the eventuality that schematic revisions and circuit simulations may need to be iterated during the early stages of defining the circuit design and before the first attempt at a physical layout. Besides possibly only occurring on the first run through this sub-process 130, step 136 is also optional in that a user might wait for the first circuit simulations to be executed within step 150 to assess performance. It might also be desired to iterate the steps 134 and 136 if the schematic is updated by the parasitic extraction process that feeds in schematic changes through path 308. Similarly, step 138, setting up the design database, is optional in that it might only need to be performed the first time through step 130, or a design database may already have been set up and available in the PDK or from another user. It may also be desirable to alter the design database later in the design process, after returning to this segment from other portions of the process.

Figure 1C:
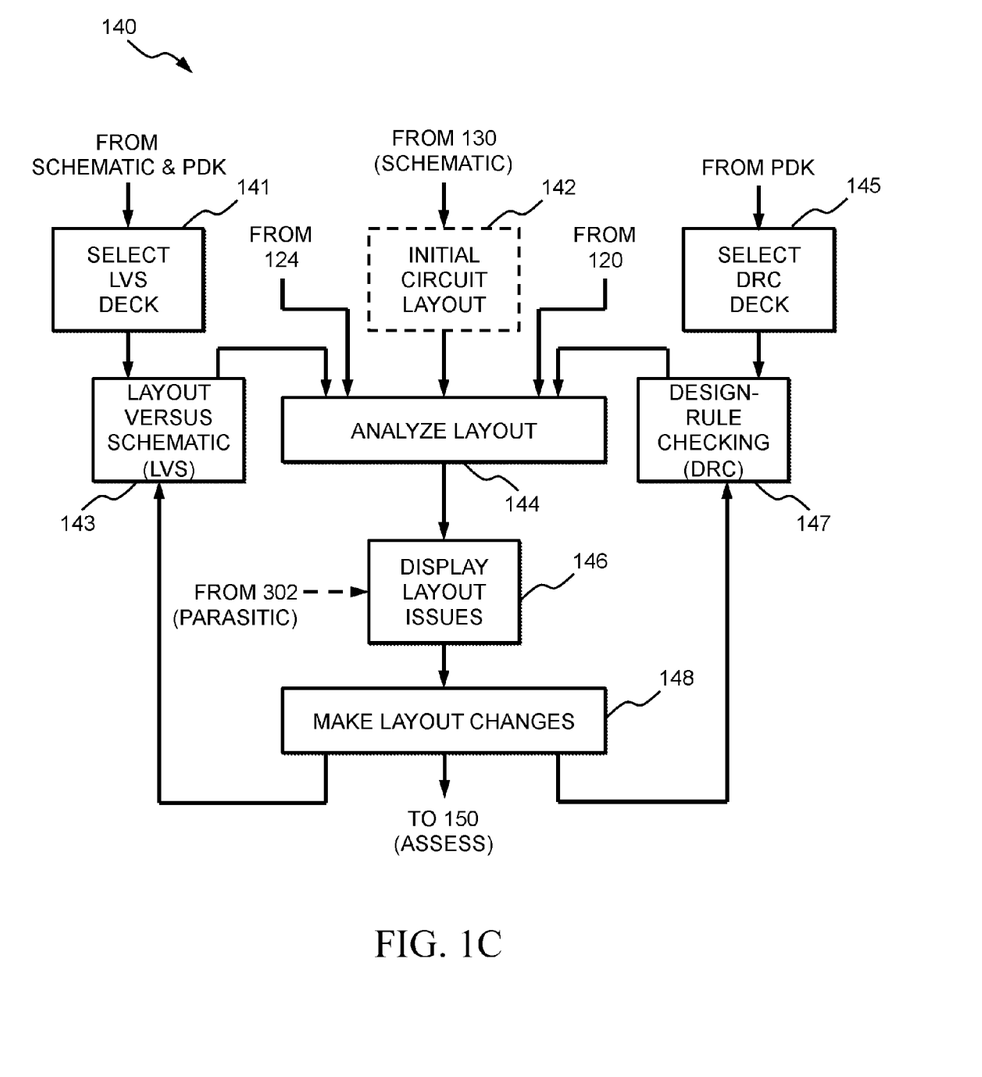

Referring now to FIG. 1C, a detailed flow chart illustrating the circuit layout process 140 is shown. This segment is entered from step 130 and the initial circuit layout, step 142, is shown as optional because it only needs to be performed the first time through. As is the case for the schematic, this could be entered from an existing design. Often the schematic directed layout (SDL) features of the EDA tool suite can be used to generate the initial circuit layout. It is also possible to incorporate standard and rad-hard cells and PCells from the rad-hard PDK. A parameterized cell (PCell) is a piece of programming code that can be read by the layout and simulation software and that represents a component of a circuit, such as a transistor, whose structure is dependent on one or more parameters. A PCell is a cell which is automatically generated by electronic design automation (EDA) software based on the values of these parameters. PCells allow devices to scale with specified parameters such as width and length, and also allow structural changes within the cell (for instance, the addition of contacts or changing the shape of a device). Although most PCells are a physical representation of an electronic component describing its physical structure inside an IC, device symbols in circuit schematics may also be implemented as PCells. Complex PCells might require inclusion of additional code in the PDK.

Continuing on to step 144, after a layout exists, then it can be analyzed using verification tools. These tools include layout versus schematic (LVS) tools and design rule checking (DRC) tools. Step 144 is the step in which the existing layout is analyzed using these LVS and DRC tools. Inputs to the DRC checker come from the PDK via step 145, in which an appropriate DRC "deck" (computerized list of rules) is selected for the desired radiation tolerance level and presented to the DRC checker to be used in step 147. Likewise, LVS is performed using an LVS deck selected in step 141, and iterated as required, as indicated by the circulating paths through the layout steps to steps 143 (LVS) and 147 (DRC).

As an example of design rule checking iteration, in step 144, the DRC output is analyzed to see where suggested changes might be accommodated (while considering other size and/or performance goals). In step 146, layout issues are displayed either from this analysis, or from the parasitic component extraction analysis. Then selected layout changes are actually implemented in step 148. The revised layout is then once again returned for DRC until all design rules are met (DRC is passed). A similar process occurs for LVS. After layout changes are satisfactory, the layout is then passed to step 150 for assessment of performance with regard to rad-hard and other goals.

Figure 1D:
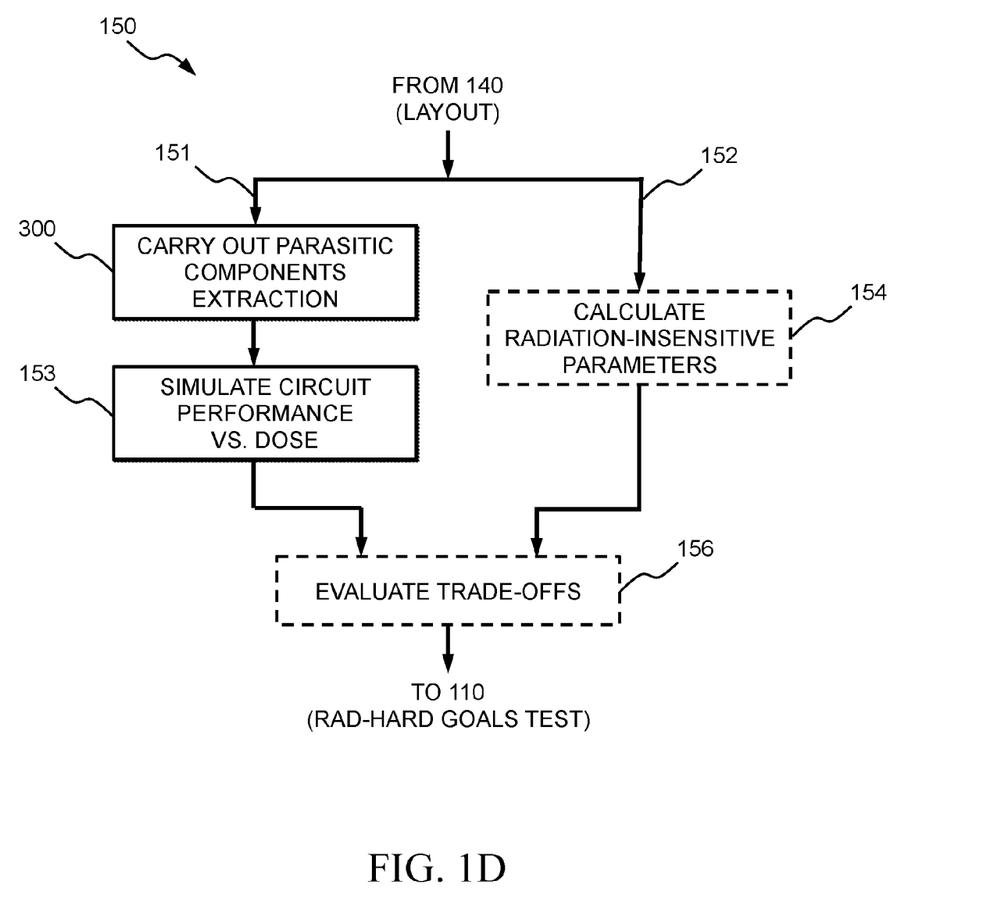

The assessment of performance, step 150, is detailed in the flow chart diagram of FIG. 1D. There are two paths through the assessment: the left branch 151 refers to the steps related to assessing the radiation tolerance (rad-hard) goals, and the right branch 152 relates to the evaluation of other goals. In the right branch, in step 154, radiation-insensitive parameters such as circuit area are calculated. In the left branch, in step 300 an extraction of radiation-induced parasitic components is performed. Then the circuit is simulated (e.g. using SPICE with rad-hard SPICE models) in step 153 for different levels of radiation dose. This allows the list of radiation-affected components and layout areas to be identified for further ranking and analysis. Finally, in step 156, this ranking and analysis may be evaluated as a trade-off study. If only radiation goals are important, then the trade-off need not be performed, so this step is shown as optional. In either event, the results of this assessment and simulation are passed on to the rad-hard goals test 110.

As previously mentioned, several of the rad-hard tools and data for their use can be supplied as part of a process-specific process design kit (PDK). For example, the layout design rule checking will depend on a rad-hard DRC deck incorporating knowledge about design rules related to which types of layout structures are most likely to be affected by radiation. Referring now to FIG. 2, a block diagram of a rad-hard PDK according to an embodiment of the present invention is shown. Inputs to the knowledge and construction of the elements or components of the PDK 200 are shown at the left. Rad-hard device types and symbols 220 are inputs to the devices, cells, and SPICE models. Knowledge of rad-hard layout techniques 222 is built into the rad-hard design rules 204 incorporated into DRC decks. Experimental measurements of device parameters 224, e.g.

under different radiation conditions and temperatures, are incorporated into the SPICE parameters. Thus the rad-hard PDK 200 can include some or all of the indicated components: rad-hard design rules 204, rad-hard SPICE models 206, rad-hard cell libraries 208, which incorporate known rad-hard devices into functional blocks or individual transistors, and rad-hard PCells 210 which are parameterized cells as described earlier that have been designed to have certain rad-hard features. Besides these rad-hard specific components, standard PDK components 202 may also be included for non-rad-hard circuit design and for those devices and cells whose radiation performance is not critical. The rad-hard PDK interfaces with different elements of the EDA tool suite, e.g. the design rule checker and the SPICE circuit simulators, through different data interfaces indicated by interface 230. This interface is bidirectional because layout, parasitic parameter extraction and other functions described in relation to various embodiments of the present invention as well as normal functioning and maintenance of the standard PDK can cause certain elements of the rad-hard PDK 200 to require updating.

Figure 3:
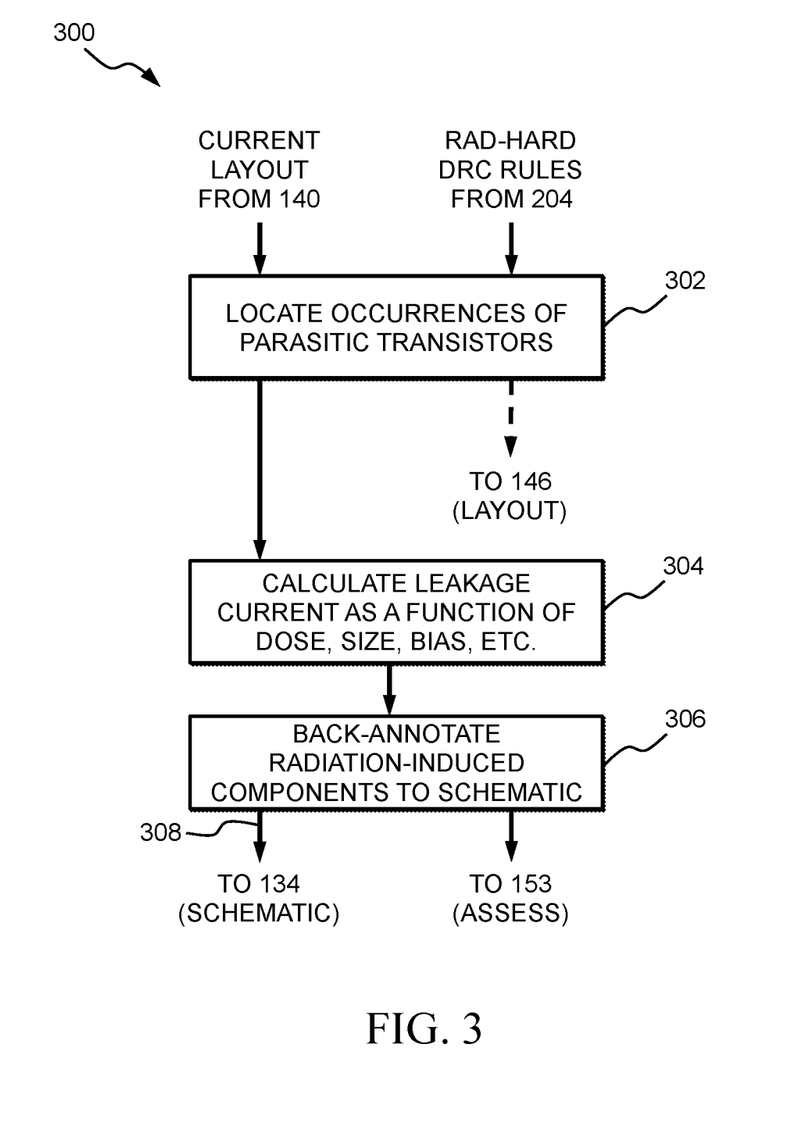
FIG. 3 is a flow chart illustrating a method for carrying out a parasitic component extraction process according to an embodiment of the present invention.

FIG. 3 shows a flow chart illustrating a method 300 for carrying out a parasitic component extraction process that has been referred to previously in several places. Unlike common terminology, in which parasitic extraction is referring mainly to passive components like capacitance affecting IC interconnects, herein the word "parasitic" is referring specifically to the types of radiation-induced parasitic components such as the parasitic transistors discussed earlier. In order to assess the impact of radiation due to these parasitic transistors, the following steps are performed. Step 302 locates occurrences of parasitic transistors that are induced by radiation, using as inputs the current circuit layout presented from layout step 140 and the known rad-hard DRC rules from block 204, which will help the tool know where to look in the layout for potential issues. Once these occurrences are located, they can be optionally highlighted in the physical design view on the layout in step 146. The list of occurrences of parasitic components is processed in step 304 to calculate the leakage current of each parasitic device as a function of dose, device size and PCell parameters, bias voltage, temperature, etc. Now that the parasitic component parameters have been defined, in step 306 the connections and parameters of these components can be back-annotated to the schematic for circuit simulation within the assessment step 150 (specifically, in step 153).

Figure 4A:
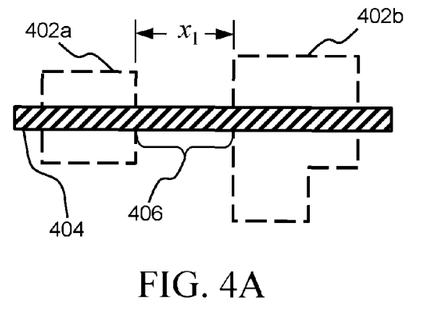
FIGS. 4A through 4E depict mask layouts illustrating examples of rad-hard layout techniques to be used in conjunction with various embodiments of the present invention.

Exemplary layout changes that might be suggested by step 112 are illustrated in FIGS. 4A through 4F. FIGS. 4A through 4E show mask layout changes as they might appear in the physical design layout tool. In FIG. 4A, two neighboring NMOS active regions 402a and 402b related to source and/or drain of NMOS transistors (NSD) are shown that are both crossed by a first-level interconnect line 404 which may represent polysilicon or metal interconnect. The two active regions need not belong to the same device, but the interconnect that passes between them can form a parasitic transistor between them in the region underneath it and between the NSD patterns, as indicated by reference numeral 406. The spacing between the two active regions is indicated by the variable $x_1$. In this case, radiation-induced leakage current can be reduced by increasing the spacing $x_1$, and such an increase can be suggested by a rad-hard tool according to an embodiment of the present invention.

Figure 4B:
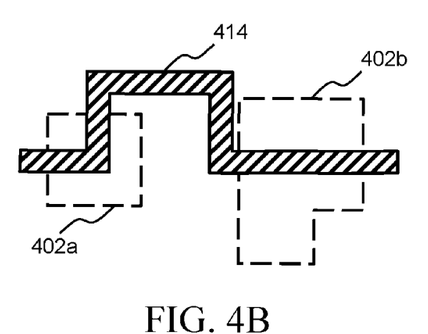
Figure 4C:
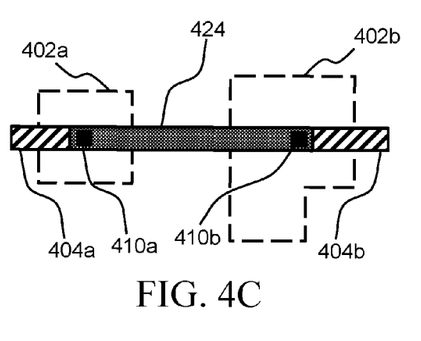

A different solution to the leakage path 406 is shown in FIG. 4B, in which an interconnect line 414 is shown taking a different and longer path to a side to break up the direct leakage path. In cases where increasing the spacing between active regions cannot be accommodated, this is a potential alternative suggestion. Another alternative interconnect change is shown in FIG. 4C, in which the first-level interconnect is broken into two segments 404a and 404b that do not extend between the active regions 402a and 402b. In order to make the connection, vias 410a and 410b can be used to carry the signal to a higher-level interconnect 424 between the two devices. Such a higher-level interconnect will have a weaker effect in forming a parasitic channel, since it is separated by thicker dielectric from the surface of the silicon. Models for the behavior of these structures can be included in a rad-hard PDK 200 according to some embodiments of the present invention.

Figure 4D:
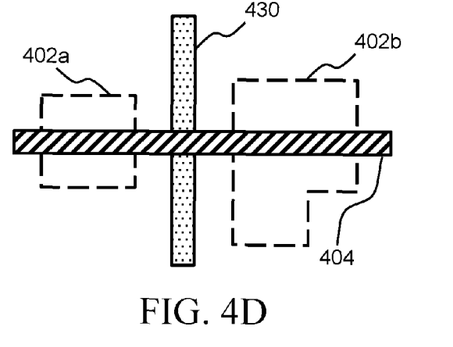

In FIG. 4D, a guard band 430 or guard ring formed using p-type doping can be inserted to break up the leakage path. This is also a technique known to be effective, but that can add size and complexity to the circuit.

Figure 4E:
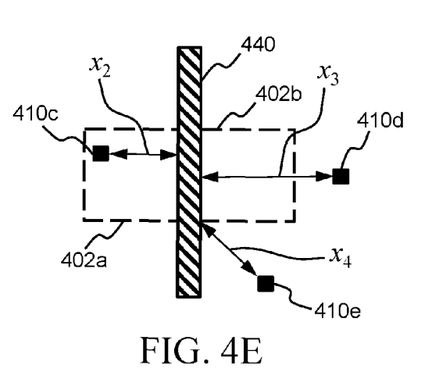

FIG. 4E illustrates a design rule regarding the spacing of tungsten vias 410c, 410d, and 410e from an NMOS transistor gate 440 (typically implemented as a doped polysilicon level like the first-level interconnect shown in FIGS. 4A through 4D). It is known that high-energy x-rays striking a tungsten via will generate secondary x-rays of a lower energy, that can in turn affect circuitry within a radial distance of the via. Thus, a design rule to keep tungsten vias 410c, 410d, and 410e a minimum distance from a transistor gate that can be affected by these secondary x-rays, as indicated by distances $x_2$, $x_3$, and $x_4$, respectively, depending on the radial distance to the channel, can be built into a rad-hard DRC deck using rad-hard design rules 204 and layout techniques 222, according to an embodiment of the present invention.

Figure 4F:
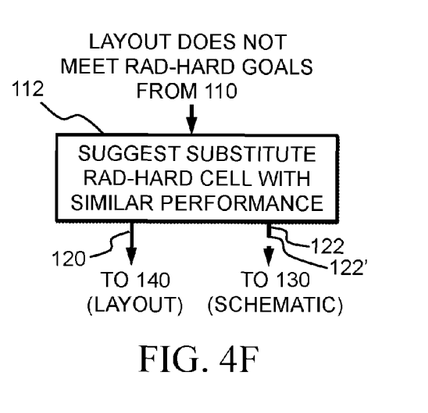
FIG. 4F is a flow chart illustrating one method for suggesting layout changes according to an embodiment of the present invention.

Finally, another way to suggest a layout change 112 is depicted using the flow chart of FIG. 4F illustrating a method of suggesting an alternative device. If the layout does not meet rad-hard goals, then the substitution of a standard cell or PCell with a rad-hard cell or PCell can be suggested. Such a substitute can change the size and/or performance of the circuit. Thus the suggested change needs to be communicated either to the layout via path 120 and/or to the schematic or to the requirements via optional paths 122 and 122', respectively. Examples of alternative rad-hard transistor designs include annular, edgeless, and notched source/drain transistors.

A computer-implemented method for rad-hard IC design implemented according to the teachings herein will have the capability to consider radiation tolerance, and apply rules needed to achieve a particular radiation tolerance goal. This allows the circuit designer to assess the impact of implementing the radiation-tolerance-improvement features on overall IC design goals, and to carry out optimization to best meet these overall goals. For example, if the die area of a particular design is input-output (I/O) limited, the circuit designer may elect to take a more conservative approach with respect to performance, designing in extra radiation tolerance, which increases the core area at no extra die cost, whereas if a particular design is pushing the limits of die-area goals, the designer may need to take a less conservative approach, and design-in a lower level of radiation tolerance.

Figure 5:
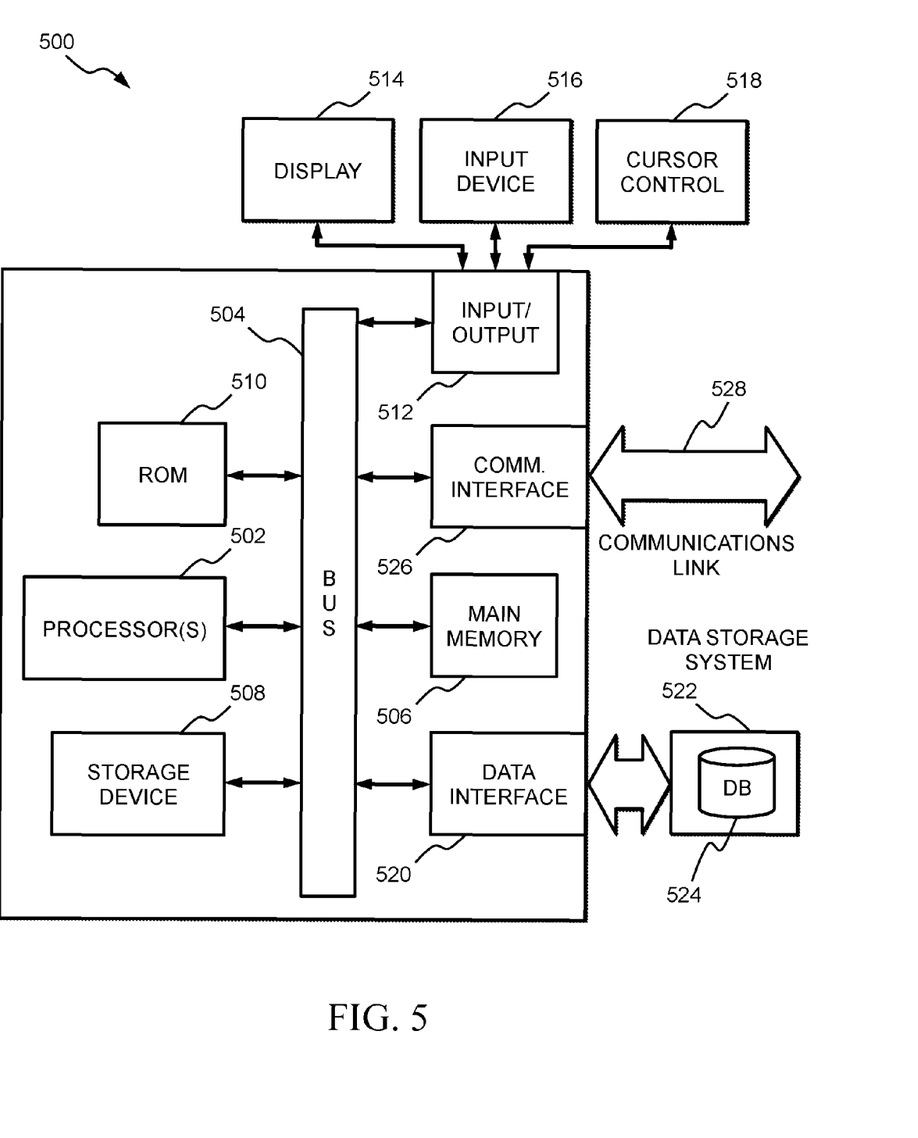
FIG. 5 is a block diagram illustrating a computing system on which a method for designing a radiation-hardened integrated circuit can be implemented according to an embodiment of the present invention.

FIG. 5 is a block diagram illustrating an exemplary computing system 500 suitable for implementing some embodiments of the present invention. Computing system 500 includes one or more processors 502 executing one or more sequences of instructions of program code logic contained in main memory 506 and communicating through a bus 504 interconnecting processor(s) 502 and other components of the system. Instructions may be read into main memory 506 from another computer usable storage medium such as static read-only memory (ROM) 510 or storage device 508 which may, for example, be a magnetic or optical hard disk drive (HDD) or solid-state drive (SSD) using e.g. flash memory circuitry. Operation by a human user may be facilitated by providing an input/output port 512 connected to a human-readable display 514, an input device 516 such as a keyboard, and a cursor control device 518 for drawing and interacting with items shown on display 514.

Integrated circuit design data, as well as data and instructions related to PDK 200 and program data, may be stored and operated upon in interaction with a data storage system 522. Computing system 500 communicates with the data storage system 522 through a data interface 520. Data interface 520 transmits and receives electrical, electromagnetic, or optical signals that include data streams representing various types of information such as instructions, messages, and data. Design data for integrated circuits may be voluminous and require large amounts of storage, and thus the data storage system 522 may be required to have a higher capacity than e.g. internal storage device 508. This design data may be stored as a database 524 residing upon data storage system 522 and organized for convenient access and updating by the EDA tools and by the program code logic facilitating one or more aspects of the present invention.

In some embodiments of the invention, certain functions of the data interface 520 may be performed by the communications interface 526. Computing system 500 may transmit and receive messages, data, and instructions, including program, i.e. application code, through communications link 528 and communications interface 526. Instead of storing design database 524 in data storage system 522, the design data may be stored remotely on a server accessed through communications link 528. This type of system configuration can facilitate multiple users working together on the same IC design. In addition to communicating with remotely stored design data, communications link 528 may also be used to communicate design data and to coordinate work with other users at their computing systems. Program code logic embodying certain aspects of the present invention may optionally be provided to computing system 500 over communications link 528 instead of via a computer program product on fixed media. Similarly, an embodiment of the present invention may be a method executed on a remote processor such as a virtualized program running on a server, and computing system 500 may be used simply as the human interface to this virtualized processor.

Figure 6:
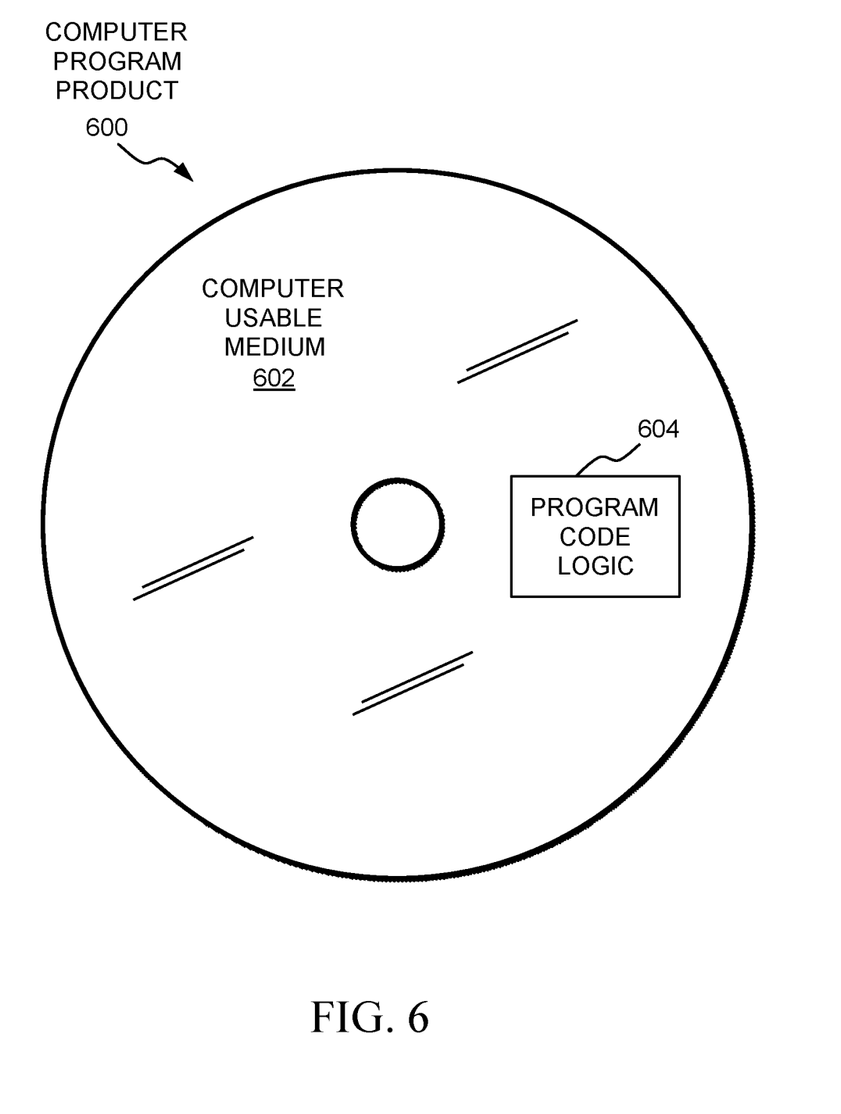
FIG. 6 illustrates one embodiment of a computer program product to incorporate one or more aspects of the present invention.

The invention or components thereof may be embodied in a computer program product, an example of which is illustrated in FIG. 6. A computer program product 600 includes, for example, one or more computer usable media 602 storing thereupon computer readable program code logic 604 containing logic instructions and/or data that when loaded into an appropriately configured computing system cause that system to perform or facilitate one or more aspects of an embodiment of the present invention. Although the illustrated medium 602 takes the form of an optical compact disc (CD) or digital versatile disc (DVD), it will be understood that any combination of one or more computer usable media may be used to store the program code logic 604, including, but not limited to, an optical, magnetic, electronic, infrared, or semiconductor system, apparatus, or device such as EPROM or flash memory. That is, a computer-usable medium 602 may be any storage medium that can store the program code logic 604 for use by or in connection with a computing system 500 or other instruction execution system or device. Likewise, it will be understood that the program code logic 604 for carrying out operations of the present invention may be written in any combination of one or more programming languages, including compiled, interpreted, macro languages, object oriented or conventional programming languages.

Although preferred embodiments provided by the present invention have been described in detail, and several alternative forms of the invention have been shown, it will be apparent to those skilled in the art that the principles taught herein may be implemented in many other ways and by using methods and systems differing in a number of details. For example, each block in the flow chart or block diagrams may represent a module, segment, or portion of code, comprising one or more executable instructions for implementing the specified function(s). In some alternative implementations, the functions noted in the block may occur out of the order noted in the figures. For example, two blocks shown in succession may be executed substantially concurrently, or sometimes in reverse order, depending on the functionality involved. Some of the steps may be implemented manually by the user of the method or system, and some may be automatically performed by a computing system. Besides an embodiment that is partly manual, the present invention can also take the form of an entirely hardware embodiment, an entirely software embodiment, or an embodiment combining some software and some hardware aspects.

As another example of alternative forms of the invention, embodiments of the invention as a computer program product may be embodied in whole or in part as software recorded on fixed media. A fixed media program may be delivered to a user on fixed media for loading in a user's computer, or it may reside on a remote server that a user accesses through a communication medium in order to run or download a program component. It will therefore be understood by those skilled in the art that various modifications can be made therein without departing from the spirit and scope of the invention as set forth in the appended claims.

I claim:

1. A computer-implemented method for designing a radiation-hardened integrated circuit comprising the steps of:
    entering a schematic of a circuit, said circuit comprising at least a portion of an integrated circuit, and a list of requirements comprising a radiation-hardness requirement and another goal, said radiation-hardness requirement comprising a requirement that the circuit meet a predetermined specification upon exposure to ionizing radiation at a specified first Total Ionizing Dose (TID) level;
    generating an initial layout of the circuit;
    assessing, using a computing system, a rad-hard performance of the circuit, said rad-hard performance characterized by a second TID level, upon exposure to which the circuit, if fabricated as laid out, will fail to meet the predetermined specification;
    evaluating a trade-off between the radiation-hardness requirement and the other goal;
    suggesting a change to the layout if the second TID level determined in assessing the rad-hard performance does not meet or exceed the first TID level specified in the radiation-hardness requirement; and
    changing the layout in response to the suggested change, whereby a resulting design for the circuit is produced that, if fabricated, will meet an overall IC design goal that achieves a predetermined rad-hard performance in conjunction with an IC design specification related to the other goal.

2. The computer-implemented method of claim 1, wherein the other goal is characterized by a radiation-insensitive parameter.

3. The computer-implemented method of claim 1, wherein the step of changing the layout is performed by the computing system.

4. The computer-implemented method of claim 2, wherein said radiation-insensitive parameter comprises a die area of the circuit.

5. The computer-implemented method of claim 1, wherein said other goal is characterized by a parameter that changes as a function of total ionizing dose.

6. The computer-implemented method of claim 1, wherein said other goal is characterized by a parameter that changes in response to the suggested change to the layout.

7. The computer-implemented method of claim 1, wherein the step of entering a schematic further comprises providing a schematic of an existing circuit that is known not to meet said radiation-hardness requirement, and the step of generating an initial layout further comprises providing a layout of said existing circuit.

8. The computer-implemented method of claim 1, wherein the circuit comprises a cell, and the resulting design for the circuit that, if fabricated, will meet the radiation-hardness requirement is included in a cell library that can be used as a component of a process design kit.

9. The computer-implemented method of claim 1, wherein the step of suggesting a change to the layout is performed by the computing system.

10. The computer-implemented method of claim 9, wherein the step of suggesting a change to the layout further comprises displaying the suggested change in a physical design layout view.

\* \* \* \* \*